United States Patent [19]

Chen et al.

[11] Patent Number: 5,895,712
[45] Date of Patent: Apr. 20, 1999

[54] MAGNETIC RECORDING MEDIUM WITH IMPROVED COERCIVITY

[75] Inventors: Qixu Chen, Milpitas; Ga-Lane Chen, Fremont, both of Calif.

[73] Assignee: Seagate Technology, Inc., Scotts Valley, Calif.

[21] Appl. No.: 08/712,705

[22] Filed: Sep. 12, 1996

Related U.S. Application Data

[60] Provisional application No. 60/017,998, May 21, 1996.

[51] Int. Cl.[6] .................................................. G11B 5/66
[52] U.S. Cl. .......................... 428/332; 428/336; 428/611;
428/636; 428/655; 428/656; 428/661; 428/663;
428/668; 428/678; 428/694 TS; 428/694 TP;
428/694 TM; 428/900; 427/128; 427/131;
204/192.2; 204/298.01; 204/298.25
[58] Field of Search .................... 428/694 TS, 694 TP,
428/694 TM, 611, 636, 655, 656, 661,
663, 668, 678, 336, 332, 900; 204/192.2,
298.01, 298.25; 427/128, 131

[56] References Cited

U.S. PATENT DOCUMENTS

| | | | |
|---|---|---|---|
| 3,674,340 | 7/1972 | Jacob | 359/494 |
| 3,764,218 | 10/1973 | Schedewie | 356/365 |
| 3,938,878 | 2/1976 | Fox | 359/251 |
| 4,060,306 | 11/1977 | Swaminathan | 359/792 |
| 4,950,548 | 8/1990 | Furusawa | 428/611 |
| 5,062,021 | 10/1991 | Ranjan et al. | 360/135 |
| 5,128,914 | 7/1992 | Kurata et al. | 369/44.37 |
| 5,202,810 | 4/1993 | Nakmura et al. | 360/135 |
| 5,402,407 | 3/1995 | Eguchi et al. | 369/112 |
| 5,416,755 | 5/1995 | Endo et al. | 369/13 |
| 5,456,978 | 10/1995 | Lal | 428/332 |
| 5,462,796 | 10/1995 | Teng et al. | 428/336 |
| 5,496,632 | 3/1996 | Yamaguchi | 428/332 |
| 5,569,533 | 10/1996 | Lal | 428/332 |

OTHER PUBLICATIONS

"A New Laser Texturing Technique for High Prformance Magnetic Disk Drives," P. Baumgart et al., IEEE Trans. Mtg., proceedings of Feb., 1995.

*Primary Examiner*—Leszek Kiliman
*Attorney, Agent, or Firm*—McDermott, Will & Emery

[57] ABSTRACT

The coercivity of a magnetic recording medium is increased without any substantial change in magnetic remanence by depositing a fresh non-magnetic sub-underlayer on an underlayer or composite underlayer comprising a plurality of sub-underlayers, and immediately depositing a magnetic layer on the fresh sub-underlayer. In an embodiment of the present invention, a fresh chromium sub-underlayer having a thickness of about 55 Å to about 135 Å is sputter deposited on a chromium underlayer in the magnetic layer deposition chamber, and a cobalt magnetic layer deposited on and within 1.2 seconds after depositing the fresh sub-underlayer.

46 Claims, 9 Drawing Sheets

MAGNETIC RECORDING MEDIUM WITH IMPROVED COERCIVITY

RELATED APPLICATION

This application claims priority from provisional patent application Ser. No. 60/017,998 filed May 21, 1996, entitled "FRESH-ADDITIONAL UNDERLAYERS FOR THIN FILM MEDIA."

TECHNICAL FIELD

The present invention relates to the recording, storage and reading of magnetic data, particularly rotatable magnetic recording media, such as thin film magnetic disks. The invention has particular applicability to a high density magnetic recording medium which exhibits high coercivity and coercivity squareness, and to a method of increasing the coercivity independent of the Mrt (magnetic remanence× thickness of the magnetic film).

BACKGROUND ART

Thin film magnetic recording disks and disk drives are conventionally employed for storing large amounts of data in magnetizable form. Data are written onto and read from a rapidly rotating recording disk by means of a magnetic head transducer assembly that flies closely over the surface of the disk. The escalating requirements for high areal recording density and increasingly smaller disk drives impose increasingly demanding requirements on thin film magnetic recording media in terms of coercivity, coercivity squareness, medium noise and narrow track recording performance. The requirements for efficiency and high productivity impose additional demands for minimizing downtime of production equipment. Considerable effort has been spent in recent years to produce magnetic recording media having higher recording densities and satisfying such demanding requirements, particularly for longitudinal recording.

A conventional longitudinal recording medium is depicted in FIG. 1 and comprises a substrate 10, typically an aluminum (Al)-alloy, such as an aluminum-magnesium (Al—Mg)-alloy, plated with a layer of amorphous nickel-phosphorous (NiP). Alternative substrates include glass, glass-ceramic materials and graphite. Substrate 10 typically contains sequentially deposited on each side thereof a chromium (Cr) or Cr-alloy underlayer 11, 11', a cobalt (Co)-base alloy magnetic layer 12, 12', a protective carbon overcoat 13, 13' and a lubricant topcoat 14, 14'. Cr underlayer 11, 11' can be applied as a composite comprising a plurality of sub-underlayers 11A, 11B, 11C, 11A', 11B', 11C'. Cr underlayer 11, 11', Co-base alloy magnetic layer 12, 12' and protective carbon overcoat 13, 13' are typically deposited by sputtering techniques performed in an apparatus containing sequential deposition chambers. A conventional Al-alloy substrate is provided with a NiP plating, primarily to increase the hardness of the Al substrate, serving as a suitable surface to provide a texture, which is substantially reproduced on the disk surface.

In recent years, considerable effort has been expended to achieve high areal recording density. Among the recognized significant factors affecting recording density are magnetic remanence (Mr), coercivity (Hc), coercivity squareness (S*), signal/noise ratio, and flying height, which is the distance at which a read/write head floats above the spinning disk. Prior approaches to achieve increased areal recording density for longitudinal recording involve the use of dual magnetic layers and multilayer media. For example, Teng et al., U.S. Pat. No. 5,462,796 discloses a magnetic recording medium comprising dual magnetic layers separated by an intermediate non-magnetic layer of Cr having a thickness of about 5 Å to about 25 Å. Lal et al., U.S. Pat. No. 5,432,012 discloses a magnetic recording medium comprising a gradient magnetic layer interposed between two magnetic layers. Furusawa et al., U.S. Pat. No. 4,950,548, disclose a magnetic recording medium comprising a plurality of chromium underlayers which exhibit a bow-like columnar structure, thereby enabling low modulation independent of the surface texture. In accordance with the disclosure of Furusawa et al., at least 2 layers, preferably 3 layers, of chromium are deposited each at a thickness of about 50–200 nm.

It is, of course, highly desirable to provide a magnetic recording medium with high coercivity and S*, and high signal-to-noise ratio. The various magnetic layers conventionally employed to produce magnetic recording media, typically Co or Co-alloys, exhibit differing properties such as different signal-to-noise ratios, coercivities and other magnetic properties. For example, certain cobalt alloys, such as cobalt-chromium-tantalum (Co—Cr—Ta) alloys, exhibit a superior signal-to-noise ratio vis-à-vis Co-alloys containing Cr and platinum (Pt). However, the coercivity of Co—Cr—Ta alloys is undesirably low. It is possible to enhance the coercivity of magnetic alloys, such as Co—Cr—Ta alloys, by increasing the deposition temperature. However, high temperature deposition adversely affects various substrate materials, as by inducing crystallization of NiP. High temperature deposition also causes deformation of a texture provided on a substrate, such as protrusions formed by laser texturing.

There exists a need for a magnetic recording medium having a high signal-to-noise ratio, high S*, and high coercivity, and for a productive, efficient technique which enables the coercivity of a magnetic recording medium to be increased without resort to high temperature deposition of the magnetic layer and without substantially affecting the Mrt.

DISCLOSURE OF THE INVENTION

An object of the present invention is a magnetic recording medium exhibiting a high signal-to-noise ratio, high coercivity, and high S*.

A further object of the present invention is an efficient method of manufacturing a magnetic recording medium wherein the coercivity is enhanced without substantially affecting the Mrt.

A further object of the present invention is an apparatus for manufacturing a magnetic recording medium with enhanced coercivity and a high signal-to-noise ratio.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a magnetic recording medium comprising a non-magnetic substrate; a non-magnetic underlayer on the non-magnetic substrate; a fresh sub-underlayer of non-magnetic material on the underlayer; and a magnetic layer on the fresh sub-underlayer; wherein the fresh sub-underlayer has a sufficient thickness, and the magnetic layer has been deposited within a sufficiently short period of time after deposition of the fresh sub-underlayer, so that the coercivity of the magnetic recording medium is greater than that of a corresponding magnetic recording medium without the fresh sub-underlayer, while the magnetic remanence is substantially the same as that of the corresponding magnetic recording medium without the fresh sub-underlayer.

Another aspect of the present invention is a method of manufacturing a magnetic recording medium, which method comprises: forming a non-magnetic underlayer on a non-magnetic substrate; forming a non-magnetic fresh sub-underlayer on the underlayer; forming a magnetic layer on the fresh sub-underlayer within a sufficiently short period of time after forming the fresh sub-underlayer so that the coercivity of the magnetic recording medium is greater than that of a corresponding magnetic recording medium without the fresh sub-underlayer, while the magnetic remanence is substantially the same as that of the corresponding magnetic recording medium formed without the fresh sub-underlayer.

A further aspect of the present invention is an apparatus for manufacturing a magnetic recording medium, which apparatus comprises: an underlayer deposition chamber adapted to sputter deposit an underlayer or a composite underlayer comprising a plurality of sub-underlayers on a non-magnetic substrate; a fresh sub-underlayer and magnetic layer deposition chamber proximate the underlayer deposition chamber and adapted to sputter deposit a non-magnetic fresh sub-underlayer on the deposited underlayer or composite underlayer and to sputter deposit a magnetic layer on the sputter deposited fresh sub-underlayer therein.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
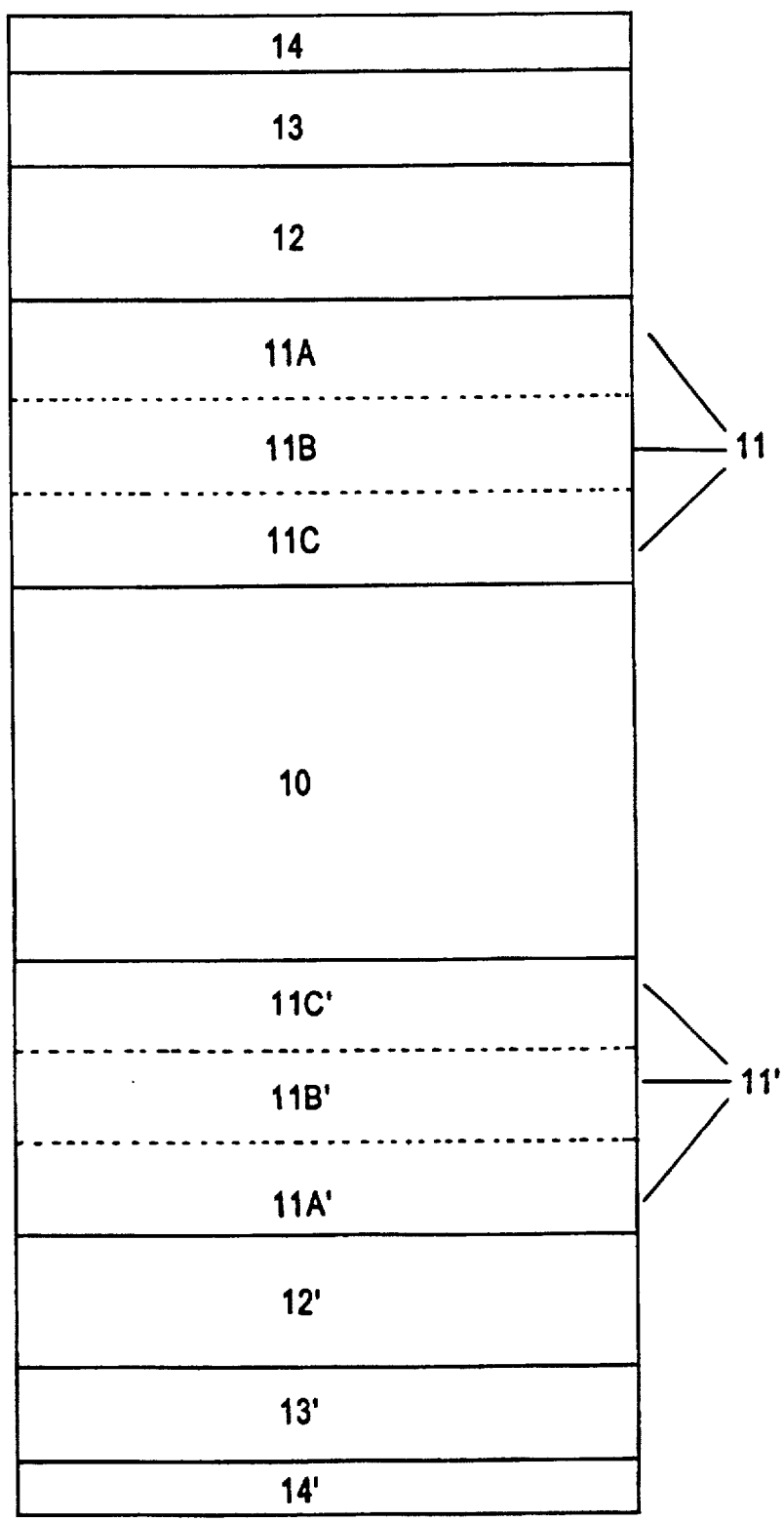
FIG. 1 schematically depicts a conventional magnetic recording medium structure.

The present invention provides a magnetic recording medium exhibiting a high signal-to-noise ratio, high coercivity, and high S*. The present invention also provides an efficient method and apparatus for manufacturing a magnetic recording medium, wherein the coercivity is tailored, e.g., increased, without substantially affecting the Mrt of the particular magnetic recording medium.

In accordance with the present invention, a non-magnetic fresh sub-underlayer is deposited on an underlayer or a composite underlayer comprising a plurality of sub-underlayers, and a magnetic layer is deposited on the fresh sub-underlayer within a very short period of time after deposition of the fresh sub-underlayer. As employed throughout this disclosure, including the specification and claims, the expression "fresh sub-underlayer" denotes a layer deposited between a magnetic layer and an underlayer or between a magnetic layer and a composite underlayer comprising a plurality of sub-underlayers, which fresh sub-underlayer alters the coercivity of the magnetic recording medium.

The magnetic layer and fresh sub-underlayer are conveniently sputter deposited in the same process chamber with appropriate shielding to avoid overlapping deposition zones. The optimum period of time between deposition of the fresh sub-underlayer and the deposition of a magnetic layer, and the optimum power density of the targets for the fresh sub-underlayer, as well as the optimum thickness of the fresh sub-underlayer, can easily be determined in a particular situation by one having ordinary skill in the art given the objective of tailoring or enhancing the coercivity without substantially affecting the Mrt. For example, it has been found that a fresh sub-underlayer comprising Cr can suitably be sputter deposited with a power density of about 22 to about 110 watts/in$^2$ at a thickness of about 17 Å to about 135 Å. In addition, it was found that deposition of the magnetic layer within 2 seconds after deposition of a Cr-containing fresh sub-underlayer, such as within 1 second after deposition, achieves the objective of the present invention of enhancing coercivity without substantially changing the Mrt.

The exact mechanism involved in increasing the coercivity without a corresponding change in Mrt by depositing a fresh sub-underlayer immediately prior to depositing a magnetic layer is not known. It is believed, however, that epitaxial growth of the magnetic layer on the fresh sub-underlayer immediately after deposition of the fresh sub-underlayer reduces contamination which would adversely affect the magnetic properties of the deposited magnetic layer.

In accordance with the present invention, the fresh sub-underlayer comprises a non-magnetic material, and can comprise the same material as the underlayer or sub-underlayers of a composite underlayer. In an embodiment of the present invention, an underlayer or composite underlayer is formed by sputter depositing Cr or a Cr-alloy, such as a Cr—Ti alloy or a Cr—V alloy. In addition, an oxygen doped chromium target can be employed to deposit a Cr sub-underlayer doped with oxygen as part of a composite underlayer. In practicing the present invention, it has been found suitable to sputter deposit a fresh sub-underlayer using a Cr or Cr-alloy target.

In accordance with the present invention, the underlayer is deposited in conventional thicknesses, such as from 300 Å to 2000 Å, typically about 500 Å to about 600 Å. In addition, a plurality of sub-underlayers can be deposited to form a composite underlayer. It has been found advantageous to sputter deposit a composite underlayer comprising a sub-underlayer containing Cr doped with oxygen.

Any magnetic layer conventionally employed in the production of magnetic recording media can be employed in practicing the present invention. It has been found particularly suitable to employ conventional Co-alloys. In an embodiment of the present invention, the magnetic layer comprises a Co—Cr—Ta alloy, such as an alloy of Co containing about 14 atomic percent Cr and about 4 atomic percent Ta.

In another embodiment of the present invention, a conventional protective carbon overcoat is deposited on the magnetic layer. A conventional lubricant topcoat can also be deposited on the protective carbon overcoat.

The present invention is not limited to any particular type of substrate and, therefore, can be practiced employing any of various substrates conventionally employed in the production of magnetic recording media. For example, substrates suitable for use in the present invention include Al, Al-alloys, NiP coated Al and NiP coated Al-alloys, glass, glass-ceramic materials, and carbon substrates. In an embodiment of the present invention, the substrate comprises a NiP coated Al-alloy.

In another embodiment of the present invention, the substrate is textured in accordance with conventional practices, such as mechanical polishing or laser texturing. In copending application Ser. No. 08/647,407 now pending methods are disclosed for laser texturing a substrate.

In accordance with the present invention, the fresh sub-underlayer is sputter deposited and a magnetic layer is sputter deposited on and within a very short period of time subsequent to sputter depositing the fresh sub-underlayer, so that the coercivity of the magnetic recording medium is tailored, e.g., enhanced, without any substantial change in the Mrt. In an embodiment of the present invention, the magnetic layer is sputter deposited on and immediately after sputter depositing the fresh sub-underlayer, as within 2 seconds, for example, within 1 second, thereby minimizing contamination and providing a clean surface for epitaxial growth of the magnetic layer. Moreover, the relevant parameters are adjusted to control the thickness of the fresh sub-underlayer and the deposition power density of the fresh sub-underlayer to achieve the desired enhancement in coercivity. As one having ordinary skill in the art would recognize, the thickness of the sputter deposited fresh sub-underlayer can be controlled by adjusting the target power to the fresh sub-underlayer target and/or pallet speed. It has been found suitable to limit the thickness of a Cr or Cr-alloy fresh sub-underlayer to about 17 Å to about 135 Å to realize an advantageous enhancement in coercivity of about 200 Oersteds without any substantial change in the Mrt of the magnetic recording medium. The present invention advantageously permits the use of relatively low soaking temperatures and/or relatively short soaking times prior to initiating sputter deposition. Basically, a Cr fresh sub-underlayer can be deposited employing normal bias and pallet speed for a magnetic layer and a DC magnetron cathode for a nonmagnetic target. When providing magnetic layers on each side of a substrate, it has been found advantageous to independently control the target power for each fresh sub-underlayer to achieve substantially the same coercivity on each side of the substrate.

The present invention can be implemented in an efficient, cost-effective manner by modifying existing equipment. Thus, an apparatus in accordance with the present invention is similar to a conventional apparatus for manufacturing a magnetic recording medium comprising a plurality of sequential chambers for implementing sequential phases during the manufacturing process, including chambers for sputter depositing a plurality of layers, one of which is a magnetic layer deposition chamber. However, in accordance with an embodiment of the present invention, the magnetic layer deposition chamber is modified by providing a target for sputter depositing a fresh sub-underlayer, such as a Cr or Cr-alloy target. The magnetic layer deposition chamber is further modified by providing shielding adapted to prevent overlap of the deposition zones of the fresh sub-underlayer and magnetic layer.

Figure 2:
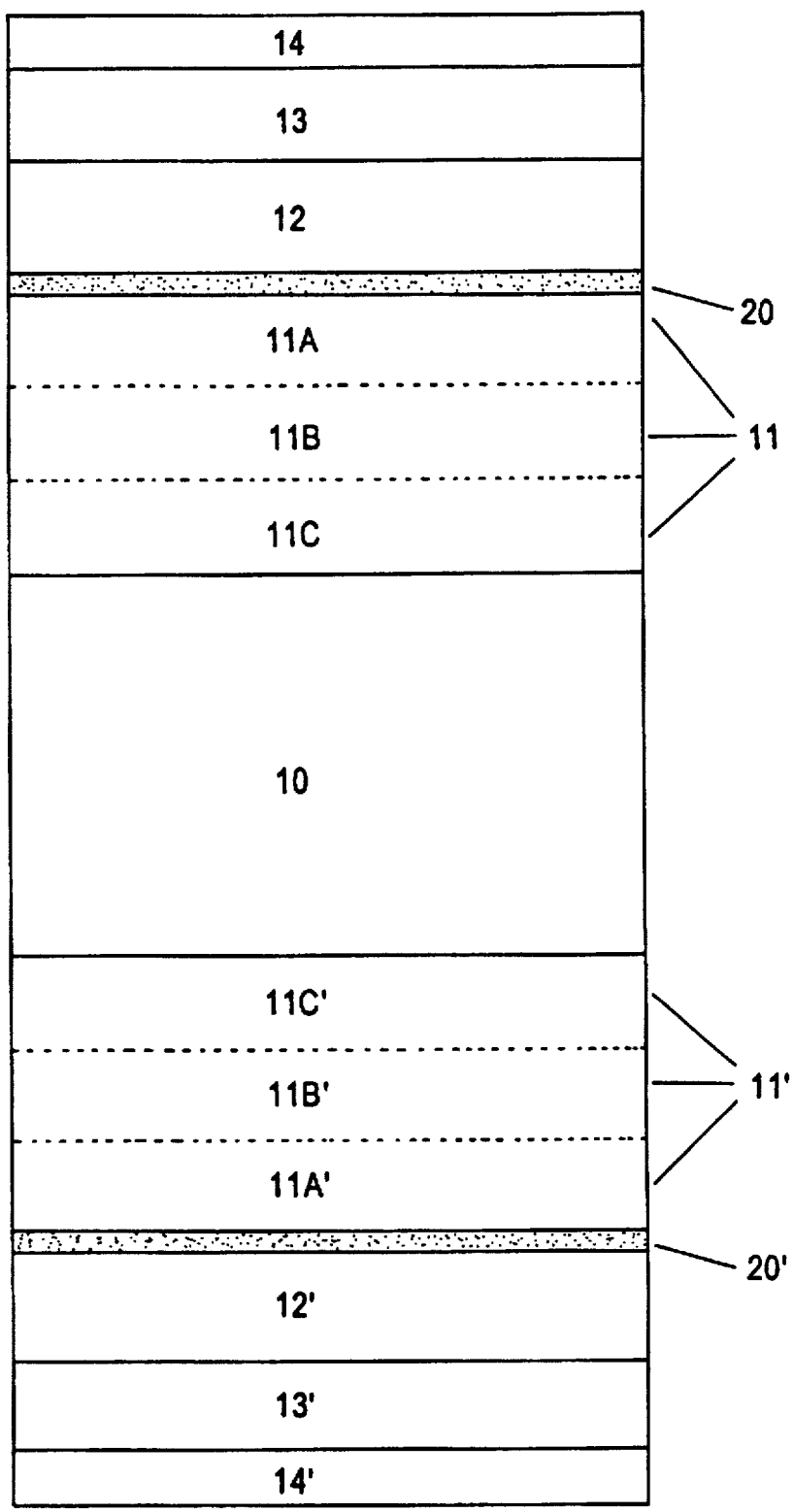
FIG. 2 schematically depicts a magnetic recording medium in accordance with an embodiment of the present invention.

A magnetic recording medium in accordance with the present invention is illustrated in FIG. 2, wherein elements similar to those in FIG. 1 bear similar reference numerals. The embodiment in accordance with the present invention depicted in FIG. 2 differs from a conventional magnetic recording medium, such as that depicted in FIG. 1, by virtue of the presence of a fresh sub-underlayer 20, 20', on composite underlayer 11, 11', immediately under magnetic layer 12, 12'.

Figure 3:
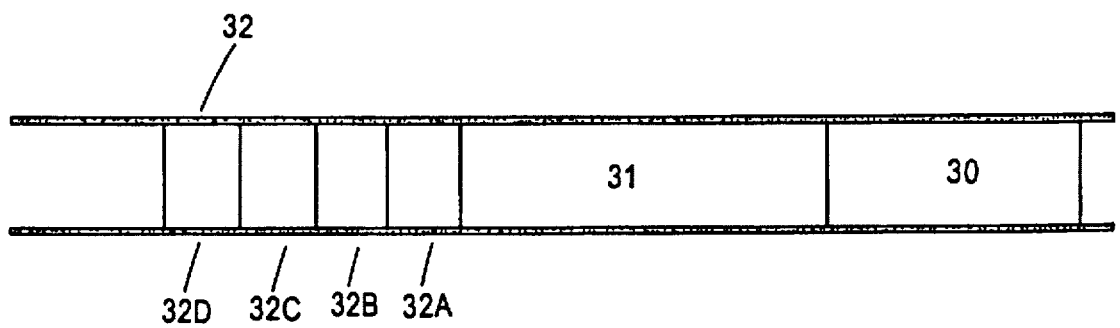
FIG. 3 schematically illustrates a portion of a conventional apparatus for producing a magnetic recording medium.

A portion of an apparatus conventionally employed to produce a magnetic recording medium is schematically illustrated in FIG. 3, and comprises a processing chamber 30 for depositing an underlayer, such as Cr, a Cr-alloy, or Cr doped with oxygen, an intermediate chamber 31 wherein the pallet speed can be changed and bias voltages in chambers 31 and 32 can be isolated, and a magnetic layer deposition chamber 32. The deposition of the underlayer or composite underlayer on the one hand, and deposition of the magnetic layer on the other hand, are typically implemented in separate deposition chambers, so that different substrate bias, pallet speed and gas pressure during deposition can be employed. As one having ordinary skill would recognize, the depicted portion of the apparatus comprises components for deposition on one side of a substrate to facilitate understanding. In practice, the apparatus comprises components to effect deposition of similar layers on each side of the substrate to form a magnetic recording medium as shown in FIG. 2.

During magnetron sputtering, the surface of the target is eroded nonuniformly. Accordingly, in order to utilize the targets in a more efficient manner, we have found it particularly efficient to provide a plurality of magnetic targets 32a, 32b, 32c and 32d. Thus, a plurality of targets are employed so that as one target is worn down, another target can be conveniently used without equipment shutdown. The use of a plurality of targets enables simultaneous replacement of all targets, thereby minimizing equipment down time.

Figure 4:
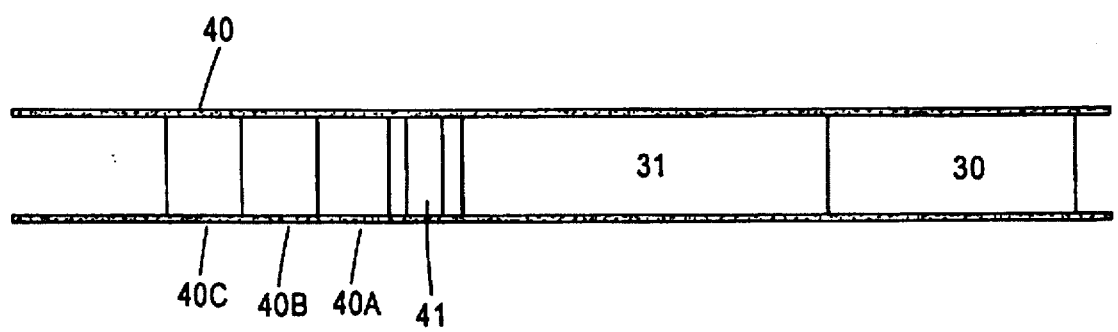
FIG. 4 schematically illustrates a portion of an apparatus in accordance with an embodiment of the present invention.

In an embodiment of the present invention depicted in FIG. 4, the magnetic layer deposition chamber 32 of the apparatus depicted in FIG. 3 is modified by providing a section adapted to accommodate a fresh sub-underlayer target and by providing suitable shielding. Adverting to the portion of the apparatus depicted in FIG. 4, wherein elements similar to those of the apparatus depicted in FIG. 3 bear similar reference numerals, the magnetic layer deposition chamber 40 comprises section 41 comprising a fresh sub-underlayer target, e.g., Cr or a Cr-alloy, with suitable shielding, for sputter depositing a fresh sub-underlayer immediately prior to sputter depositing a magnetic layer thereon. Thus, as a conventional pallet enters magnetic layer deposition chamber 40, a fresh sub-underlayer is sputter deposited on the underlayer or composite underlayer immediately prior to sputter depositing a magnetic layer on the fresh sub-underlayer. Subsequently, conventional methodology can be employed to sputter deposit a protective carbon overcoat on the magnetic layer and to form a lubricant topcoat on the protective carbon overcoat. The apparatus, of course, comprises components (not shown) to deposit layers on each side of a substrate. A plurality magnetic layer targets, e.g., three, can advantageously be positioned to deposit layers on each side of the substrate to minimize equipment downtime.

Figure 5:
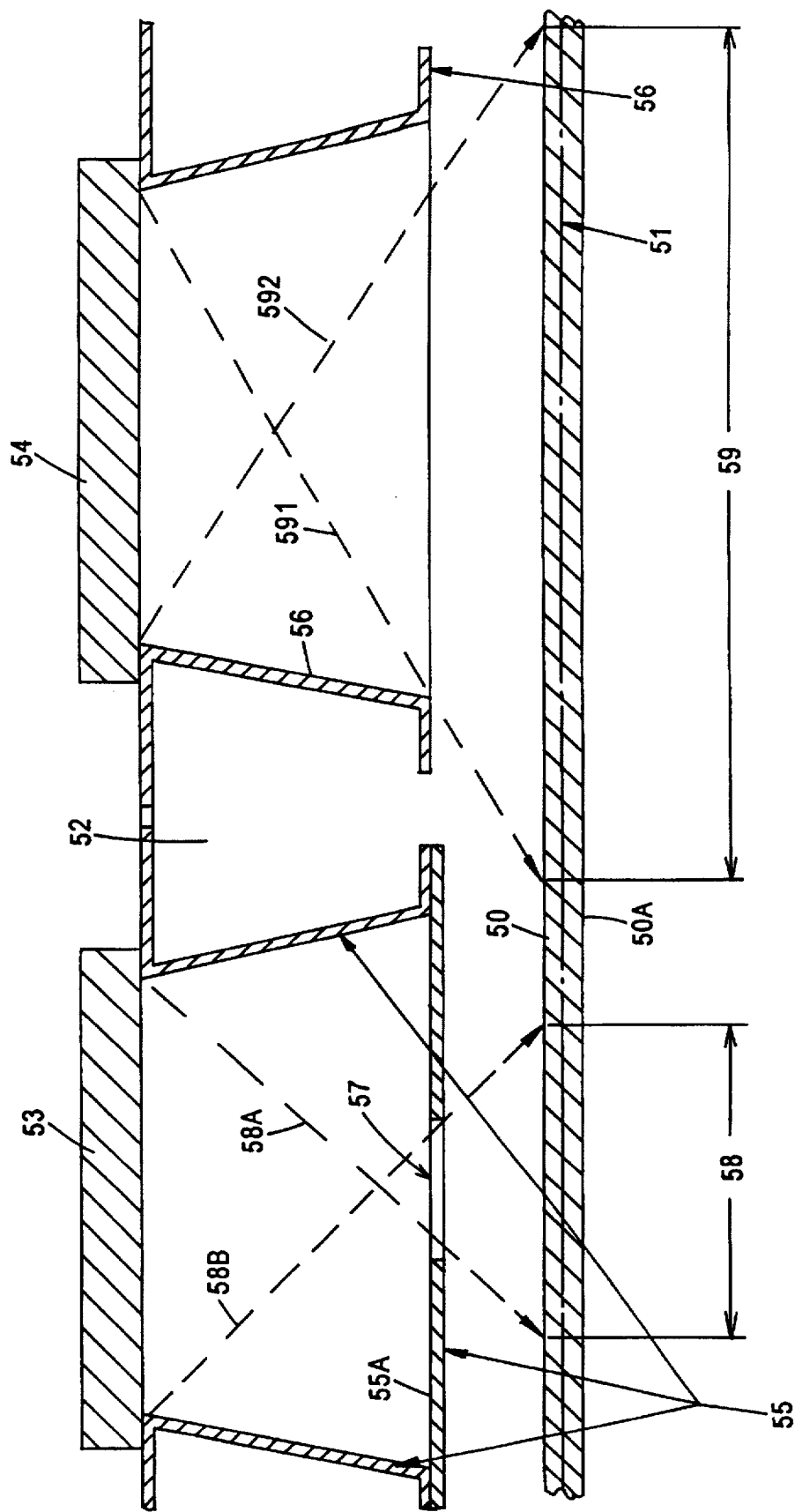
FIG. 5 schematically illustrates a portion of a magnetic deposition chamber in accordance with an embodiment of the present invention.

In FIG. 5 there is depicted an exploded view of a magnetic layer deposition chamber in accordance with an embodiment of the present invention. The substrate surface 50, having an underlayer or composite underlayer thereon with a corresponding surface 50A on the other side of center line 51, enters magnetic layer deposition chamber 52 which contains a target 53 for sputter depositing a fresh sub-underlayer, and a target 54 for immediately sputter depositing a magnetic layer on the deposited fresh sub-underlayer. Magnetic layer deposition chamber 52 contains shielding 55 in addition to conventional shielding 56. Shielding 55 comprises a section 55A positioned between fresh sub-underlayer target 53 and substrate surface 50 on which an underlayer or composite underlayer has been deposited. Shielding section 55A contains a gap 57 through which the fresh sub-underlayer is sputter deposited on the underlayer or composite underlayer in deposition zone 58, indicated by phantom arrows 58A and 58B. As depicted in FIG. 5, shielding 55 is configured to preclude overlap of the fresh sub-underlayer deposition zone 58 and magnetic layer deposition zone 59, indicated by phantom arrows 591 and 592. Fresh sub-underlayer and magnetic layer targets and shielding (not shown) are also provided to deposit layers on surface 50A of the substrate to produce a magnetic recording medium as shown in FIG. 2.

EXAMPLES

Figure 6:
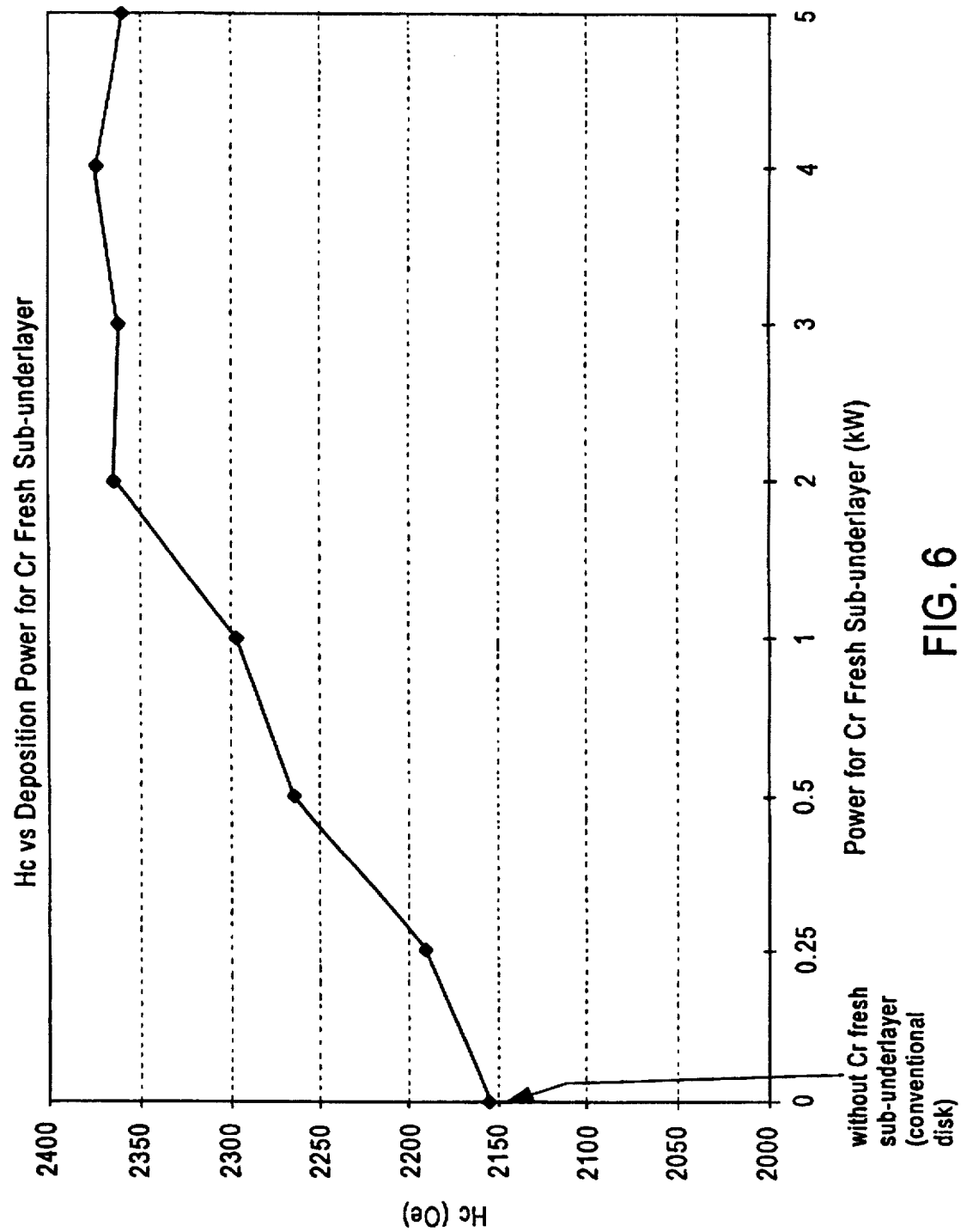
FIG. 6 is a graph illustrating the dependence of coercivity on target power in an embodiment of the present invention.

A magnetic recording medium was produced in accordance with the present invention employing a Co—Cr—Ta magnetic alloy containing 10.5 atomic percent Cr and 4 atomic percent Ta, Cr composite underlayer and Cr fresh sub-underlayer. The magnetic layer deposition chamber contained shielding having a one inch gap for the fresh sub-underlayer target. In each run, the magnetic layer was deposited on the Cr fresh sub-underlayer within 1.2 seconds of depositing the fresh sub-underlayer. The thicknesses of the fresh sub-underlayers ranged from 0 to about 135 Å. The graph depicted in FIG. 6 shows the coercivity (Hc) as a function of the power supplied to the Cr fresh sub-underlayer target in the magnetic layer processing chamber. The coercivity of a conventional magnetic recording medium without the Cr fresh sub-underlayer is indicated by an Hc of 2150, and the Mrt of the magnetic recording media produced in accordance with the present invention was consistently about 2.0 memu/cm$^2$ measured with an RMM (remanent moment magnetometer). Thus, it is apparent that, by appropriate adjustment of the power to the Cr fresh sub-underlayer target within the magnetic layer deposition chamber, the coercivity can be enhanced by 200 Oe for a magnetic recording medium in which the thickness of the fresh sub-underlayer ranged from about 55 Å to about 135 Å.

Figure 7:
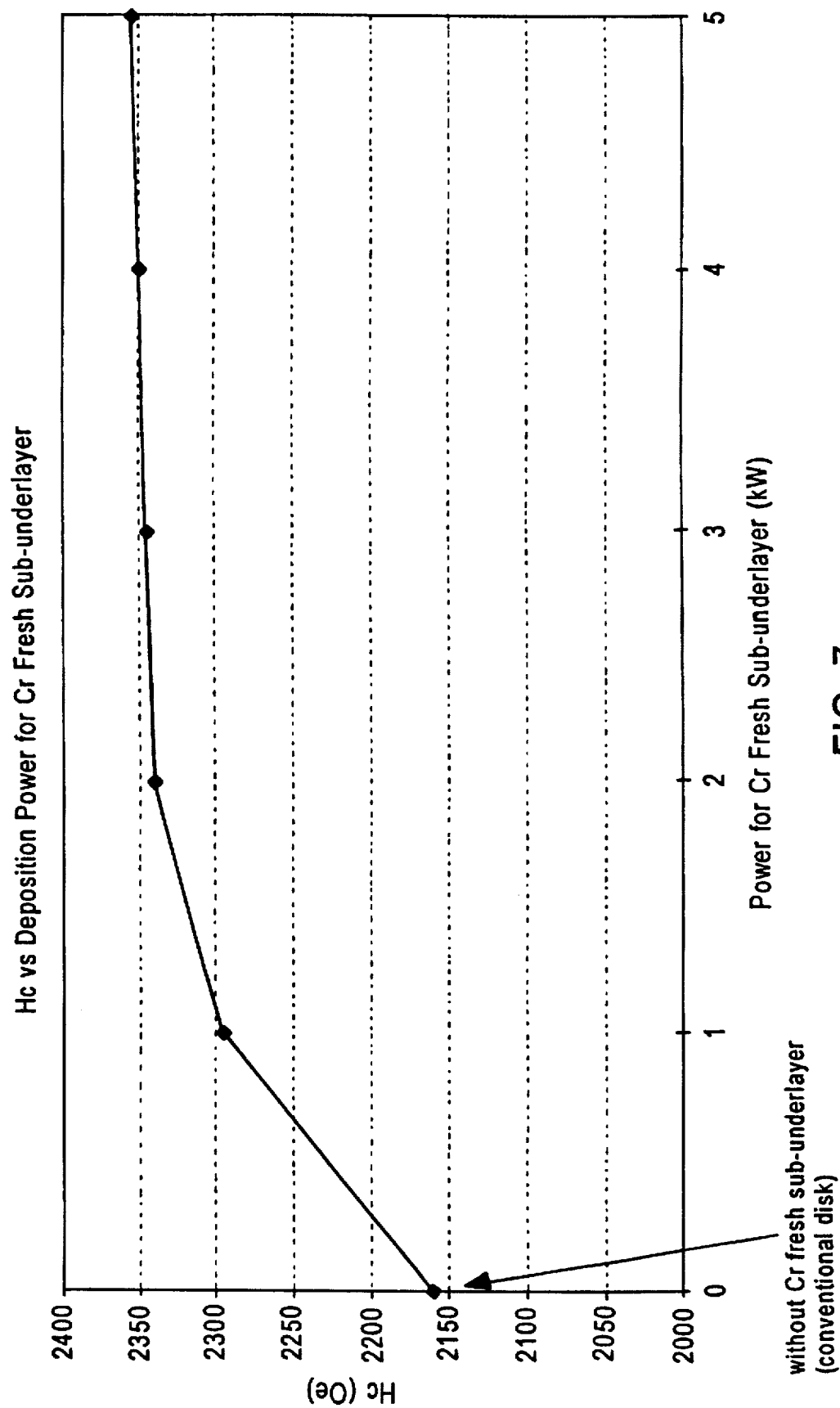
FIG. 7 is a graph illustrating the dependence of coercivity on target power in another embodiment of the present invention.

Additional magnetic recording media were prepared similar to those reported in FIG. 6, except that the shielding gap was 0.5 inches instead of one inch. The results are reported in the graph depicted in FIG. 7 and also show an increase in coercivity of about 200 Oe without any substantial change in the Mrt for the magnetic recording medium comprising a fresh sub-underlayer with a thickness of about 27 Å to about 68 Å.

The method in accordance with the present invention is efficient, easy to control and cost-effective. The coercivity is saturated when the power density to the Cr fresh sub-underlayer is greater than about 44 watts/in$^2$. The thickness of the chromium fresh sub-underlayer produced at about 44 watts/in$^2$ employing a one inch gap is about 55 Å.

Figure 8:
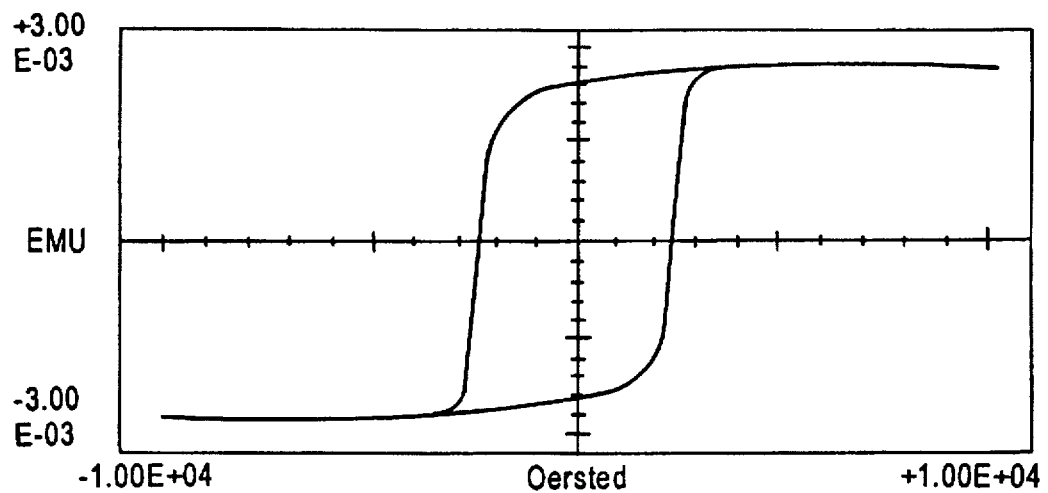
FIG. 8 represents a hysteresis curve for a magnetic recording medium of the present invention.

A hysteresis loop of a magnetic recording medium produced in accordance with the present invention is depicted in FIG. 8 as measured with a VSM (vibrating sample magnetometer). The magnetic recording medium contained a Cr composite underlayer and a Cr fresh sub-underlayer deposited on the Cr composite underlayer. Advantageously, the magnetic recording medium exhibited a coercivity of 2448 Oe, an Mrt of 2.19 memu/cm$^2$ and an S* 0.91 as shown in Table 1.

TABLE 1

| Hmax | 1.000E + 04 | Oersted |
|---|---|---|
| Is | 2.703E − 03 | EMU |
| Ir | 2.458E − 03 | EMU |
| SQ | 9.093E − 01 | Ir/Is |
| S* hys | 9.084E − 01 | 1-(Ir/Hc) (1/Slope at Hc) |
| Hc | 2.448E + 03 | Oersted |
| dH | 1.124E + 02 | between +.5*Ir and −.5*Ir |
| SFD | 1.124E − 01 | dH/Hc |
| Slope at .758Hc | 2.042E − 01 | (EMU (at H = 0) - EMU (at H = Hc/1.33))/Ir |
| Mrt | 2.19 | memu/cm$^2$ |

Figure 9:
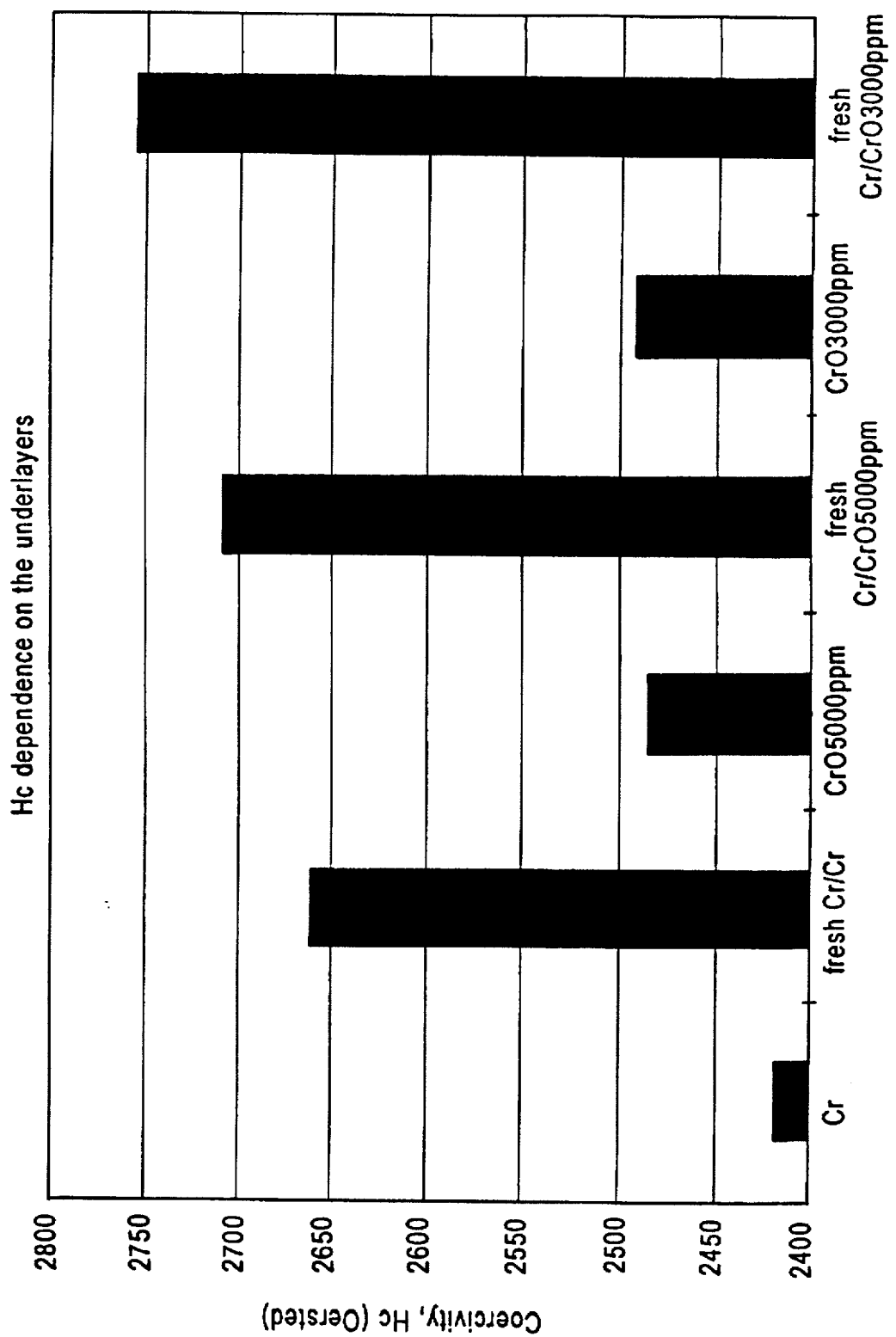
FIG. 9 is a graph comparing an embodiment of the present invention to prior art.

The graph depicted in FIG. 9 compares the coercivity of magnetic recording media with and without a Cr fresh sub-underlayer of the present invention. The compared magnetic recording media were similar in all respects except for the Cr fresh sub-underlayer. The comparisons involved composite underlayers of sub-underlayers comprising Cr, Cr doped with 5000 ppm oxygen and Cr doped with 3000 ppm oxygen, with and without a Cr fresh sub-underlayer applied thereon. The power applied to the Cr fresh sub-underlayer target was about 2.5 kW, and the shield gap was about one inch. The sputter deposited magnetic alloy contained Co, 14 atomic percent Cr and 4 atomic percent Ta. Apart from the deposition of a Cr fresh sub-underlayer, the deposition conditions for the compared magnetic recording media, including the number of targets, power, bias, pallet speed, gas pressure and substrate temperature were identical. Each magnetic recording medium exhibited an Mrt of about 1 memu/cm$^2$. As shown in FIG. 9, it was found that a Cr fresh sub-underlayer deposited on a Cr composite underlayer provides enhanced coercivity vis-à-vis a conventional Cr underlayer in the context of the present invention, and a Cr fresh sub-underlayer deposited on an oxygen-doped Cr composite underlayer further provides enhanced coercivity vis-a-vis a conventional Cr underlayer.

There is an occasional significant difference in coercivities at the front and rear sides of the substrate. However, upon subsequent experimentation, it was found that a magnetic recording medium having substantially the same coercivity on each side of the substrate is easily produced by independently controlling the target power to the Cr fresh sub-underlayer deposited on each side of the substrate.

Figure 10:
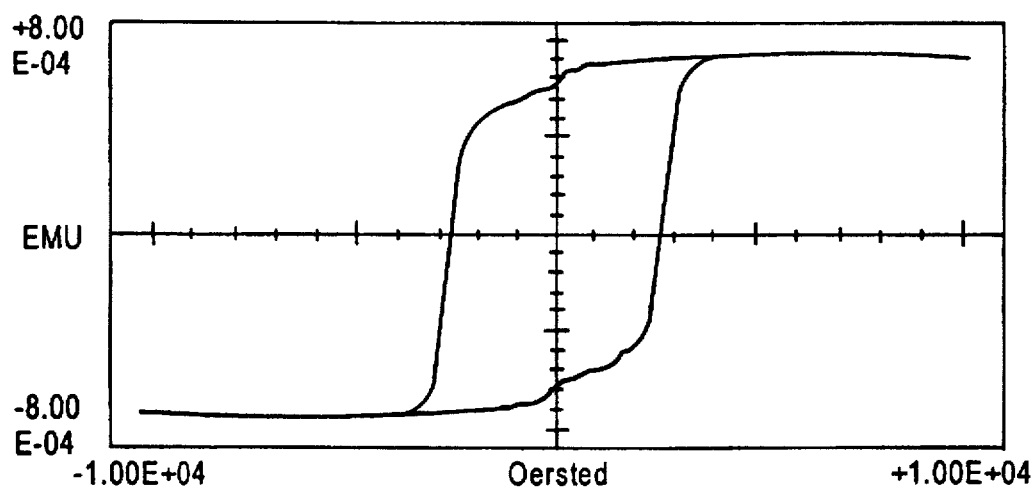
FIG. 10 represents a hysteresis curve for another magnetic recording medium of the present invention.

FIG. 10 shows a hysteresis loop for a magnetic recording medium comprising a 3000 ppm oxygen-doped Cr composite underlayer, a Cr fresh sub-underlayer thereon, and a magnetic layer comprising Co, 14 atomic percent Cr and 4 atomic percent Ta deposited on the Cr fresh sub-underlayer within 0.75 seconds after depositing the Cr fresh sub-underlayer. As shown in Table 2, the magnetic recording medium exhibits desirable magnetic properties with a coercivity of 2728 Oe, Mrt of 0.95 memu/cm$^2$ and S* of 0.89.

TABLE 2

| Hmax | 1.000E + 04 | Oersted |
|---|---|---|
| Is | 7.446E − 04 | EMU |
| Ir | 6.321E − 04 | EMU |
| SQ | 8.489E − 01 | Ir/Is |
| S* hys | 8.896E − 01 | 1-(Ir/Hc) (1/Slope at Hc) |
| Hc | 2.728E + 03 | bersted |
| dH | 3.548E + 02 | between +.5*Ir and −.5*Ir |
| SFD | 1.301E − 01 | dH/Hc |
| Slope at .75*Hc | 2.427E − 01 | (EMU (at H = 0) − EMU (at H = Hc/1.33))/Ir |
| Mrt | 0.95 | memu/cm$^2$ |

Figure 11:
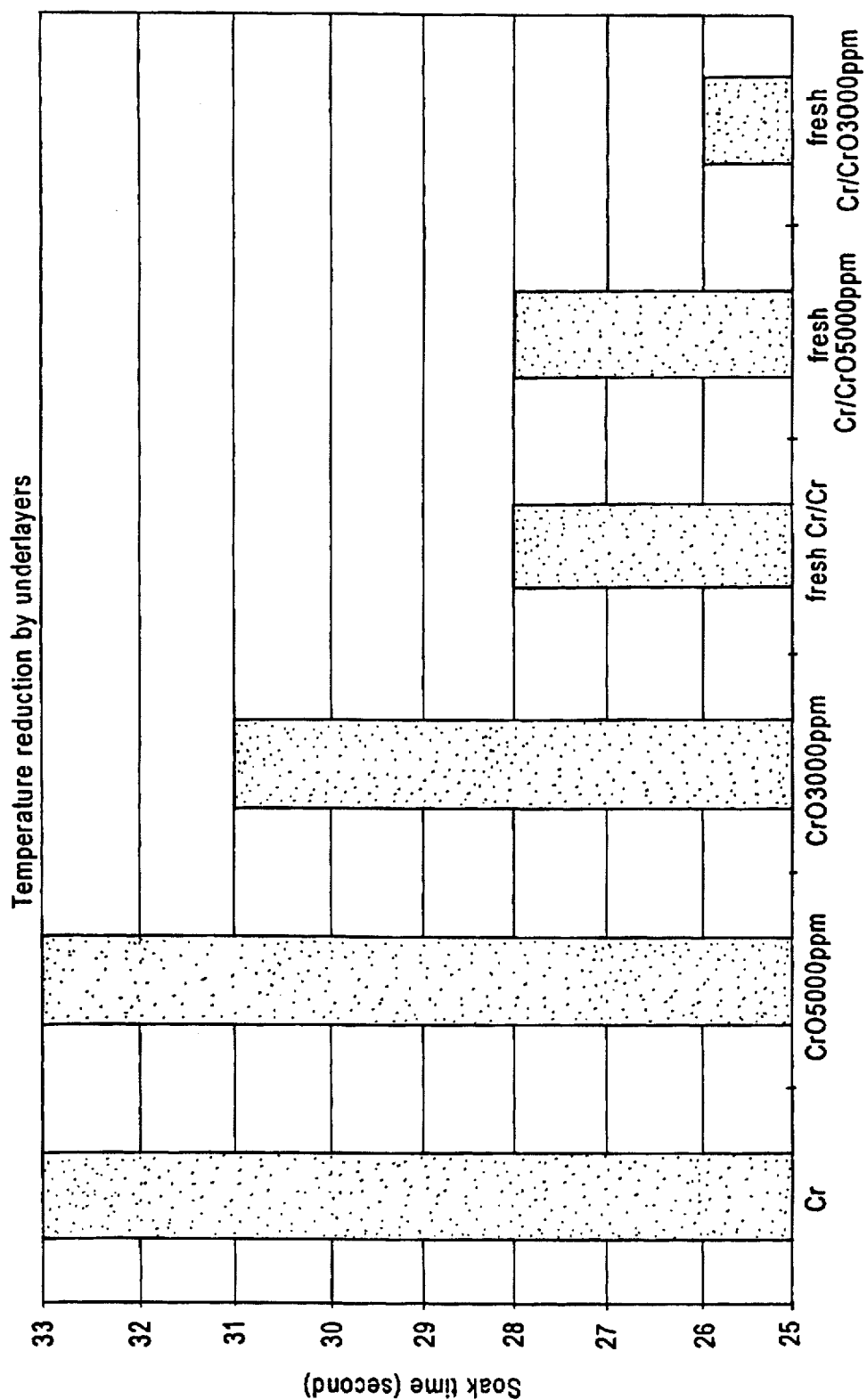
FIG. 11 is another graph illustrating lower temperatures employed in the present invention vis-à-vis the prior art.

In further examples, magnetic recording media exhibiting substantially the same Hc (about 2500 Oe) and substantially the same Mrt (about 1 memu/cm$^2$) measured with RMM were produced although they were deposited at different substrate temperatures. The graph depicted in FIG. 11 shows the temperature reduction expressed in terms of soaking time in seconds. These results are consistent with those reported in FIG. 9. The performances of the magnetic recording tests of all these media, including signal-to-noise ratio, signal output, overwrite, and PW$_{50}$ (full width of the pulse at half maximum), were similar even though the magnetic recording media with Cr fresh sub-underlayers were deposited at a lower temperature.

Thus, in accordance with the present invention, the coercivity of a magnetic recording medium is enhanced without an attendant substantial change in the Mrt. A fresh sub-underlayer, typically comprising Cr, is deposited directly on an underlayer or a composite underlayer comprising a plurality of sub-underlayers, and a magnetic layer immediately deposited on the fresh sub-underlayer, as within 2 seconds, e.g., within 1 second, after deposition of the fresh sub-underlayer. In an embodiment of the present invention, a Cr fresh sub-underlayer is deposited within a magnetic layer processing chamber modified to provide a fresh sub-underlayer target and suitable shielding. Thus, the present invention can be practiced in an efficient, cost-effective manner by modifying the magnetic layer deposition chamber of a conventional apparatus. The inventive method enables the production of a magnetic recording medium exhibiting enhanced coercivity by adjusting the target power to the fresh sub-underlayer without any substantial change in the Mrt. Further enhanced coercivity is obtained by employing an oxygen-doped Cr composite underlayer.

The underlayer or composite underlayer employed in the present invention can comprise any conventional underlayer material, such as Cr or a Cr-alloy, e.g., CrV, CrTi, or oxygen doped Cr, W or a W-alloy. Substrates conventionally employed in the production of magnetic recording media can be employed in the magnetic recording media of the present invention. Such conventional substrates include NiP-plated Al or NiP plated Al-alloys, glass, glass-ceramic materials and carbon substrates, e.g., electrically conducted graphite. Any magnetic layer conventionally employed in the production of magnetic recording media can be employed in the production of magnetic recording media of the present invention. Such conventional magnetic alloys include, but are not limited to, Co-base alloys, such as Co—Cr—Ta alloys. Co-base alloys having a thickness of about 100 Å to about 1000 Å, such as about 500 Å, have been found suitable. The present invention is not limited to the particular materials disclosed herein. For example, the fresh sub-underlayer can comprise any non-magnetic material, such as those mentioned above for the underlayer or composite underlayer.

Only certain embodiments of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A magnetic recording medium comprising:

a non-magnetic substrate;

a non-magnetic underlayer on the non-magnetic substrate;

a fresh sub-underlayer of non-magnetic material on the underlayer; and a magnetic layer on the fresh sub-underlayer; wherein the fresh sub-underlayer has a sufficient thickness, and the magnetic layer has been deposited within two seconds after deposition of the fresh sub-underlayer, so that the coercivity of the magnetic recording medium is greater than that of a corresponding magnetic recording medium without the fresh sub-underlayer, while the magnetic remanence is substantially the same as that of the corresponding magnetic recording medium without the fresh sub-underlayer.

2. The magnetic recording medium according to claim 1, wherein the underlayer contains chromium and the fresh sub-underlayer contains chromium.

3. The magnetic recording medium according to claim 2, wherein the thickness of the fresh sub-underlayer is about 17 Å to about 135 Å.

4. The magnetic recording medium according to claim 3, wherein the thickness of the underlayer is about 300 Å to about 2000 Å.

5. The magnetic recording medium according to claim 2, wherein the underlayer is a composite comprising a plurality of sub-underlayers.

6. The magnetic recording medium according to claim 5, comprising a sub-underlayer containing chromium doped with oxygen.

7. The magnetic recording medium according to claim 2, wherein the underlayer consists essentially of chromium or a chromium-alloy.

8. The magnetic recording medium according to claim 7, wherein the underlayer consists essentially of a chromium-titanium or chromium-vanadium alloy.

9. The magnetic recording medium according to claim 2, wherein the fresh sub-underlayer consists essentially of chromium or a chromium-alloy thereof.

10. The magnetic recording medium according to claim 1, wherein the magnetic layer has been deposited on and within one second after deposition of the fresh sub-underlayer.

11. The magnetic recording medium according to claim 10, wherein the magnetic layer comprises a cobalt-alloy.

12. The magnetic recording medium according to claim 11, wherein the magnetic layer comprises an alloy of cobalt, chromium and tantalum.

13. The magnetic recording medium according to claim 12, wherein the cobalt alloy contains 14 atomic percent chromium and 4 atomic percent tantalum.

14. The magnetic recording medium according to claim 2, further comprising a protective carbon overcoat on the magnetic layer.

15. The magnetic recording medium according to claim 14, further comprising a lubricant topcoat on the carbon overcoat.

16. The magnetic recording medium according to claim 2, wherein the underlayer, fresh sub-underlayer and magnetic layer are provided sequentially on each side of the non-magnetic substrate.

17. The magnetic recording medium according to claim 16, wherein the coercivity on each side of the substrate is substantially the same.

18. The magnetic recording medium according to claim 2, wherein the substrate comprises aluminum, an aluminum-alloy, nickel-phosphorous coated aluminum, a nickel-phosphorous coated aluminum-alloy, glass or a glass-ceramic material.

19. The magnetic recording medium according to claim 18, wherein the substrate comprises nickel-phosphorous coated aluminum or a nickel-phosphorous coated aluminum-alloy.

20. The magnetic recording medium according to claim 2, wherein the substrate has a surface at least a portion of which is laser textured.

21. A method of manufacturing a magnetic recording medium, which method comprises:
   forming a non-magnetic underlayer on a non-magnetic substrate;
   forming a non-magnetic fresh sub-underlayer on the underlayer;
   forming a magnetic layer on and within two seconds after forming the fresh sub-underlayer so that the coercivity of the magnetic recording medium is greater than that of a corresponding magnetic recording medium without the fresh sub-underlayer, while the magnetic remanence is substantially the same as that of the corresponding magnetic recording medium formed without the fresh sub-underlayer.

22. The method according to claim 21, comprising depositing the magnetic layer on and within 1 second after depositing the fresh sub-underlayer.

23. The method according to claim 21, wherein the underlayer contains chromium and the fresh sub-underlayer contains chromium.

24. The method according to claim 23, wherein the fresh sub-underlayer consists essentially of chromium or a chromium-alloy.

25. The method according to claim 23, comprising depositing the fresh sub-underlayer to a thickness of about 17 Å to about 135 Å.

26. The method according to claim 25, comprising depositing the underlayer to a thickness of about 300 Å to about 2000 Å.

27. The method according to claim 23, comprising sputter depositing the underlayer, fresh sub-underlayer and magnetic layer.

28. The method according to claim 27, comprising depositing a plurality of sub-underlayers to form a composite underlayer.

29. The method according to claim 28, comprising depositing a sub-underlayer containing chromium doped with oxygen.

30. The method according to claim 23, further comprising depositing a protective carbon overcoat on the magnetic layer.

31. The method according to claim 30, further comprising depositing a lubricant topcoat on the protective carbon overcoat.

32. The method according to claim 23, further comprising laser texturing the substrate before depositing the underlayer thereon.

33. The method according to claim 23, comprising depositing the underlayer, fresh sub-underlayer and magnetic layer sequentially on each side of the substrate.

34. The method according to claim 24, comprising sputter depositing the fresh sub-underlayer by supplying power to a chromium-containing target in excess of about 22 watts/in$^2$.

35. The method according to claim 33, comprising depositing the fresh sub-underlayers by independently controlling the power to a chromium-containing target on each side of the substrate.

36. The method according to claim 23, wherein the magnetic layer comprises cobalt, chromium and tantalum.

37. The method according to claim 23, wherein the substrate comprises nickel-phosphorous coated aluminum or an aluminum-alloy or a nickel-phosphorous coated aluminum-alloy.

38. The method according to claim 23, comprising depositing the fresh sub-underlayer through a port in a shield positioned between a chromium-containing target and the substrate.

39. The method according to claim 38, comprising depositing the fresh sub-underlayer and magnetic layer in the same chamber without overlapping deposition zones.

40. The method according to claim 37, comprising depositing the fresh sub-underlayer at a temperature sufficiently low to avoid crystallization of the nickel-phosphorous.

41. An apparatus for manufacturing a magnetic recording medium, which apparatus comprises:
   an underlayer deposition chamber adapted to sputter deposit an underlayer or a composite underlayer comprising a plurality of sub-underlayers on a non-magnetic substrate; and
   a fresh sub-underlayer and magnetic layer deposition chamber proximate the underlayer deposition chamber and adapted to sputter deposit a non-magnetic fresh sub-underlayer on the deposited underlayer or composite underlayer and to sputter deposit a magnetic layer on the sputter deposited fresh sub-underlayer therein within two seconds after sputter deposition of the fresh sub-underlayer.

42. The apparatus according to claim 41, comprising a controller for implementing sputter deposition of the magnetic layer.

43. The apparatus according to claim 42, comprising a controller for implementing sputter deposition of the magnetic layer on and within 1 second after sputter deposition of the fresh sub-underlayer.

44. The apparatus according to claim 41, further comprising a shield positioned within the fresh sub-underlayer and magnetic layer deposition chamber, which shield is adapted to prevent overlap during sputter deposition of the fresh sub-underlayer and magnetic layer therein, said shield comprising a section positioned between a target for depositing the fresh sub-underlayer and the substrate, which shield section contains a gap through which the fresh sub-underlayer is sputter deposited on the underlayer or composite underlayer.

45. The apparatus according to claim 41, wherein the fresh sub-underlayer and magnetic layer deposition chamber comprises: two fresh sub-underlayer targets comprising chromium positioned to deposit a fresh sub-underlayer on each side of a substrate; at least two magnetic layer targets positioned to deposit a magnetic layer on a fresh sub-underlayer on each side of the substrate.

46. The apparatus according to claim 45, wherein the fresh sub-underlayer and magnetic layer deposition chamber comprises two fresh sub-underlayer targets and at least four magnetic layer targets.

* * * * *